United States Patent [19]

Russell

[11] 4,320,246

[45] Mar. 16, 1982

[54] UNIFORM SURFACE TEMPERATURE HEAT PIPE AND METHOD OF USING THE SAME

[76] Inventor: George F. Russell, 8513 - 42nd Ave. West, Tacoma, Wash. 98466

[21] Appl. No.: 58,904

[22] Filed: Jul. 19, 1979

Related U.S. Application Data

[63] Continuation-in-part of Ser. No. 902,700, May 4, 1978, abandoned, and a continuation-in-part of Ser. No. 788,437, Apr. 18, 1977, abandoned.

[51] Int. Cl.³ .......................... H01L 31/04; F24J 3/02
[52] U.S. Cl. .................................... 136/248; 136/246; 126/433; 165/104.26
[58] Field of Search ............. 136/89 HY, 89 PC, 248, 136/246; 165/105; 126/433, 440

[56] References Cited

U.S. PATENT DOCUMENTS

| | | | |
|---|---|---|---|
| 1,690,108 | 11/1928 | Grady | 165/105 |
| 3,229,759 | 1/1966 | Grover | 165/105 |
| 3,923,038 | 12/1975 | Cutchaw | 126/433 |
| 3,990,914 | 11/1976 | Weinstein et al. | 136/89 |
| 4,027,653 | 6/1977 | Meckler | 126/433 |
| 4,069,812 | 1/1978 | O'Neill | 136/89 PC |

OTHER PUBLICATIONS

G. Y. Eastman, "The Heat Pipe", *Scientific American*, vol. 281, pp. 38–46 (1968).

*Primary Examiner*—Aaron Weisstuch
*Attorney, Agent, or Firm*—Robert W. Beach; Ward Brown; Douglas E. Winters

[57] ABSTRACT

A heat pipe includes an elongated, heat conductive shell containing heat transfer fluid which is vaporizable and condensable, and cooling means within the shell to condense the heat transfer fluid from the vapor form to the liquid form and thereby to cool the shell to approximately the same temperature throughout its length. The cooling means can include a conduit or conduits running longitudinally inside the shell of the heat pipe and carrying a circulating coolant which can be a liquid or a gas. The substantially uniform cool surface temperature of the heat pipe adapts it for use as an efficient solar energy collector with the circulating coolant serving as a heat extracting medium. Alternatively, a row of photovoltaic cells may be mounted on the uniformly cool heat pipe shell and an elongated lens used to refract solar rays to impinge concentrated or high intensity solar energy onto the targets of such cells.

7 Claims, 10 Drawing Figures

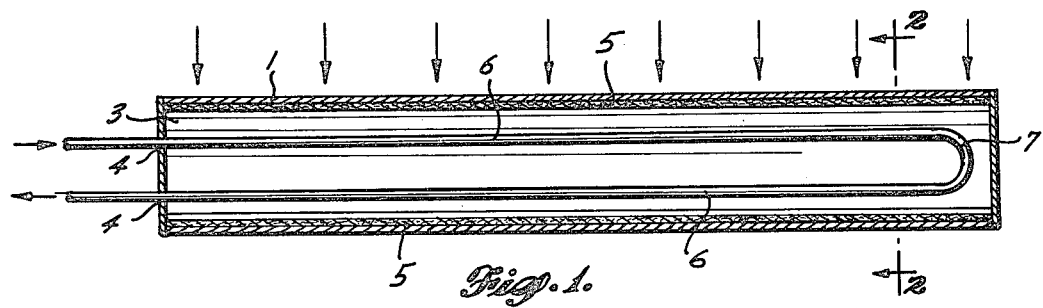
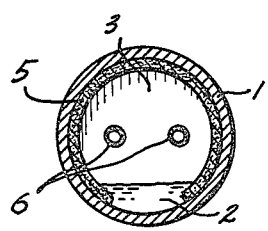
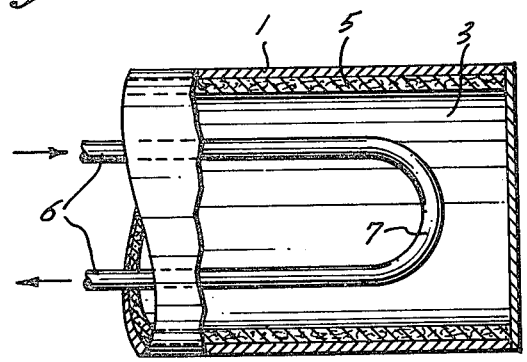
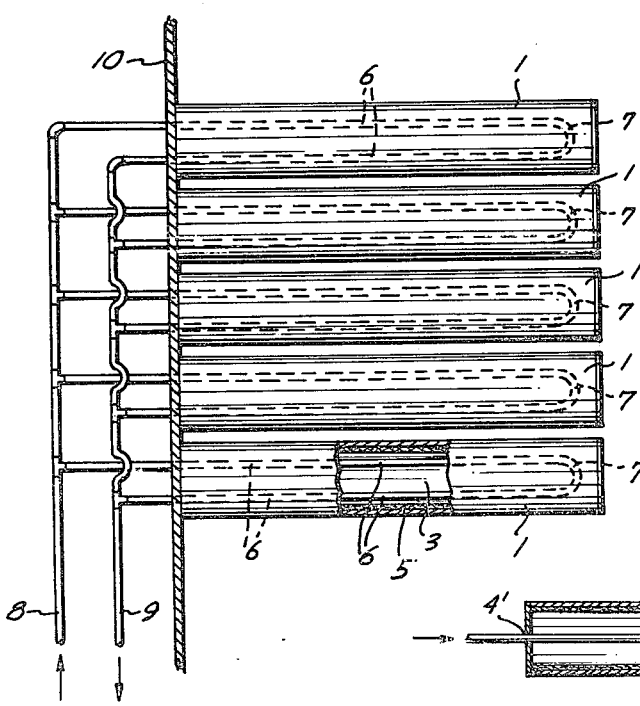
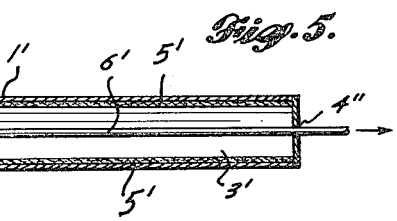
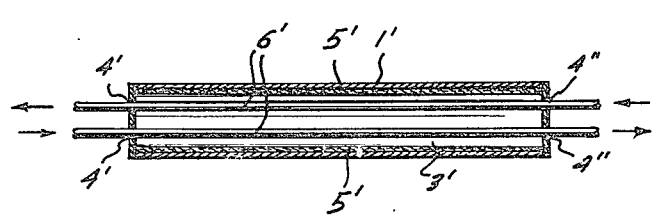

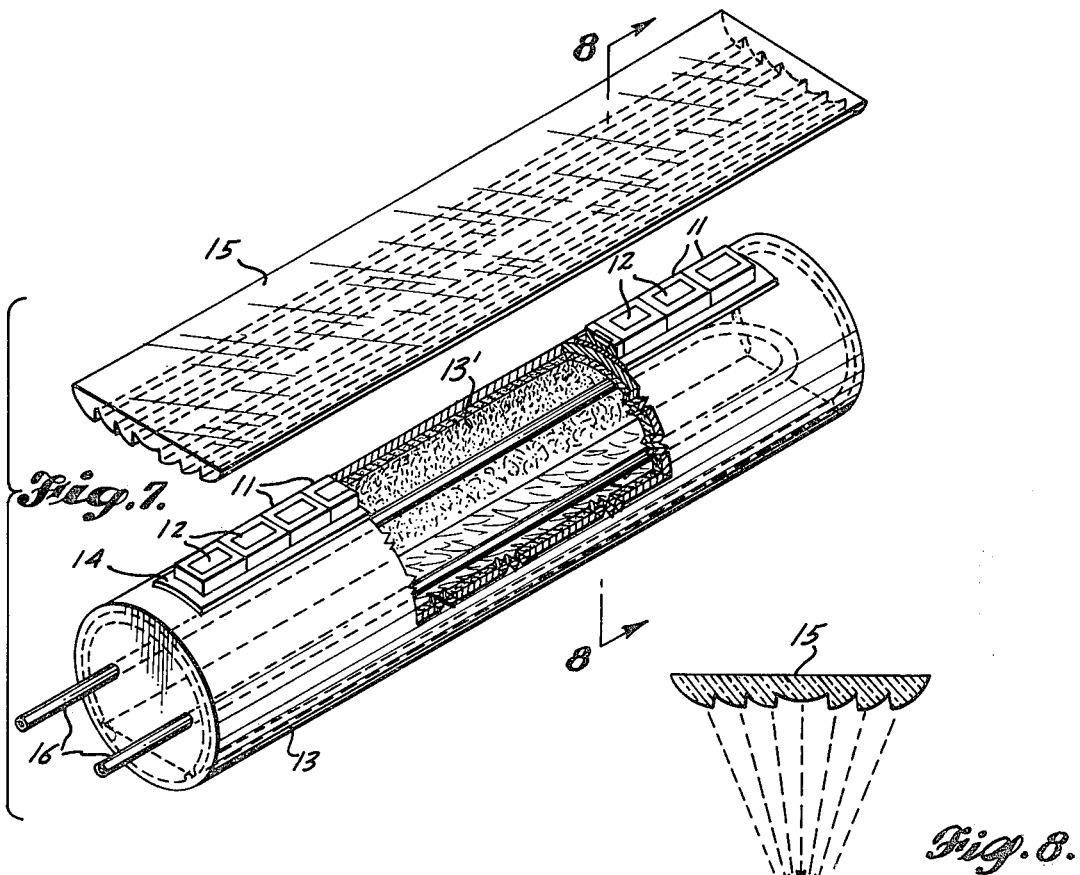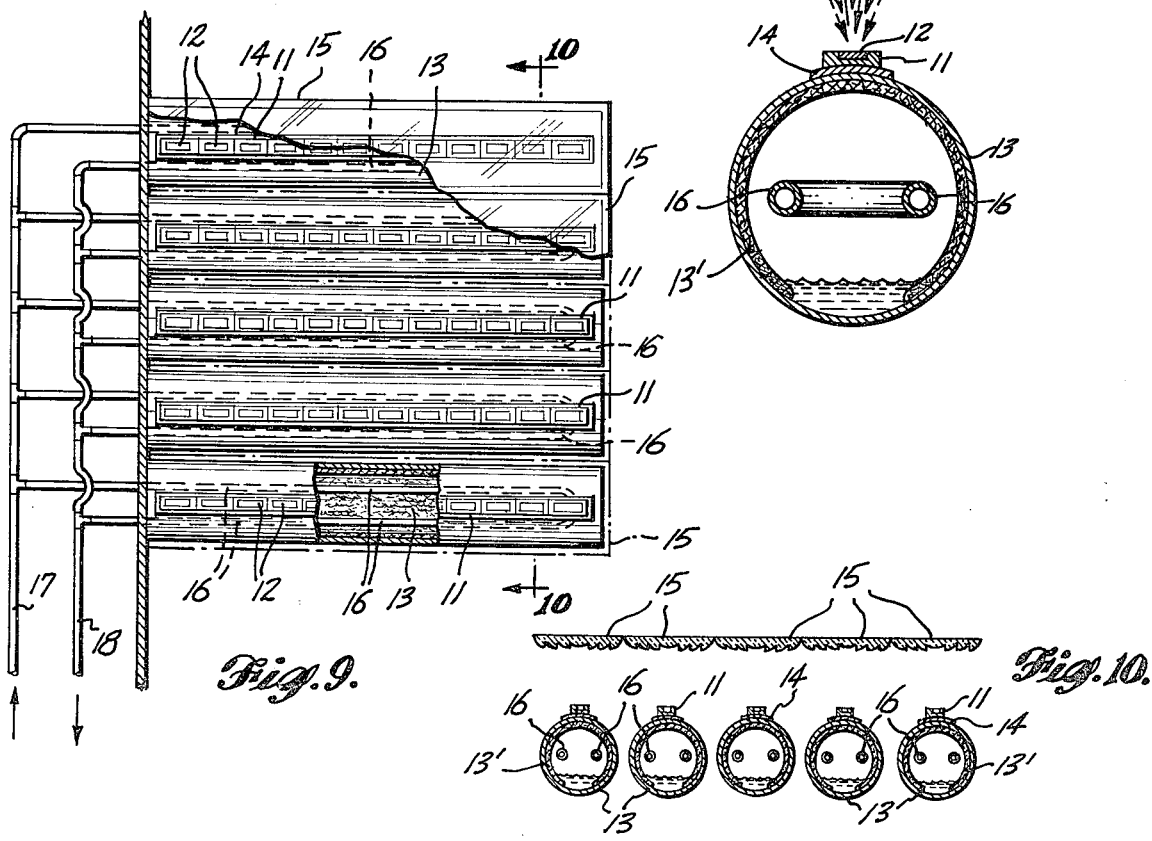

4,320,246

UNIFORM SURFACE TEMPERATURE HEAT PIPE AND METHOD OF USING THE SAME

CROSS REFERENCE

This application is a continuation-in-part of my co-pending U.S. patent applications Ser. No. 788,437, filed Apr. 18, 1977, now abandoned, for Heat Pipe With Uniform Surface Temperature Central Cooler, and Ser. No. 902,700, filed May 4, 1978, now abandoned, for Photovoltaic-Thermal Device and Process for Converting Solar Energy.

BACKGROUND OF THE INVENTION

1. Field of the Invention

The present invention relates to heat pipes and similar devices for collecting, transferring and extracting thermal energy.

2. Prior Art

Heat pipes are known which include a heat conductive shell enclosing a quantity of heat transfer fluid. Such pipes are often essentially evacuated except for the heat transfer fluid. The space not occupied by heat transfer fluid in its liquid state can be referred to as the "vapor field". Heat pipes can include an internal wick substantially covering the inner periphery of the shell for transporting heat transfer liquid by capillary action to the heat absorption portion of the shell inner periphery. Such heat pipes will transfer thermal energy from a heat absorption or collection part of the outer surface of the heat pipe shell to a heat extraction part of such outer surface. Such a heat pipe is disclosed in U.S. Pat. No. 3,229,759, and is discussed in an article entitled "The Heat Pipe" by G. Yale Eastman in the *Scientific American* for May 1968, Vol. 218, No. 5 page 38.

U.S. Pat. No. 3,779,310 of George F. Russell for a "High Efficiency Heat transit System" discloses a heat pipe having heat extracting means enclosing one end of the heat pipe. The heat extracting means supplies a cooling fluid flowing around the outer surface of the enclosed end of the heat pipe to extract heat from the pipe outer surface and to promote condensation of heat transfer vapor within the pipe.

In use, one end of a heat pipe serves as a thermal energy collector and the other end serves as a thermal energy dissipator. For example, heat pipes have been used as cooling probes for electronic devices whereby one end of a heat pipe protrudes from an enclosed hot-box of semiconductors. Heat inside the box is absorbed by the inner end of the pipe and then transferred to and dissipated by the protruding end. This type of use results in a large longitudinal temperature differential. In the above example, if the outer end of a heat pipe six inches (15.24 cm) long protrudes into a 70° F. (21° C.) ambient atmosphere, the temperature could be 250° F. (121° C.) at the inner heat pipe end and only 75° F. (24° C.) or 80° F. (27° C.) at the outer heat pipe end.

It would be more efficient if an operating heat pipe were maintained at a uniformly low temperature throughout its length because the ability of a body to absorb thermal energy is a function of the difference in absolute temperature between the body and the medium from which the energy is transferred. The hotter the body is in relation to the transferring medium, the less energy it will absorb. Here the Stephen-Boltzman law pertaining to black body radiation holds. The potential capability of a black body for radiating heat to its surroundings may be measured at any point as an amount equal to the 4th power of the differences in absolute temperatures between the ambient atmosphere and the body's temperature. A solar collector may therefore receive less energy on those portions of its surface where the temperature is high than other areas where the temperature is lower.

Photovoltaic cells used for converting solar energy into electrical energy are well known in the art, being discussed, for example, in *McGraw-Hill Encyclopedia of Science and Technology* (1971), Volume 12, beginning at page 519 under the heading "Solar Battery."

In a photovoltaic cell, solar rays impinging on one cell surface effect a direct electrical current flow between such surface and another cell surface through connecting circuitry. It is known that the electrical output of a photovoltaic cell can be increased by concentrating the solar rays impinging on the exposed cell surface, such as by refraction through a lens or reflection by a parabolic mirror. However, it is also known that impinging highly concentrated or intensified solar energy onto the exposed cell surface heats the cell, and if the temperature of the cell increases to above about 60° C., the electrical output of the cell decreases approximately linearly in relation to temperature increase.

Heat produced in photovoltaic cells as a result of their exposure to highly concentrated solar energy has been extracted and dissipated by projecting cell fins or heat sinks. In U.S. Pat. No. 3,990,914 a heat pipe has been used to extract heat from a photovoltaic cell but such heat has been extracted from the end of the heat pipe.

SUMMARY OF THE INVENTION

It is an object of the present invention to provide a heat pipe capable of operating as an energy collector while maintaining a relatively uniform outer surface temperature throughout its length.

Another object is to provide a method for transferring energy collected by a heat pipe without allowing large longitudinal temperature differentials or gradients along the heat pipe's outer surface.

A further object is to provide an efficient solar or other energy collector and means capable of transferring and extracting the energy collected.

It also is an object of the present invention to provide efficient apparatus for converting solar energy into a combination of electrical and thermal energy simultaneously.

Another object is to provide a solar energy collector in which heat is removed from photovoltaic cells to maintain them at a substantially constant temperature sufficiently low as to convert solar energy into a maximum amount of electrical energy commensurate with the ability of the cells when operating at an elevated temperature, and in which the heat removed is made available for beneficial use.

The foregoing objects can be accomplished by providing a heat pipe including a heat conductive tube lined internally with wicking for transfering heat transfer fluid in liquid form from the lower portion of the heat pipe tube to the upper portion exposed to insolation. Heat transfer fluid evaporated from the upper portion of the wick by heat produced by insolation is condensed generally uniformly throughout the length of the energy-collecting heat conductive portion of the tube and the vapor field within the heat pipe tube by coolant flowing through a conduit or conduits running longitudinally inside the tube throughout substantially the entire length of the heat pipe vapor field. Electrical energy may be produced by a straight row of photovoltaic cells mounted on the upper surface of the heat pipe tube disposed parallel to an elongated Fresnel lens with the target areas of the cells near the focus of such lens. Heat resulting from insolation is removed from that portion of the heat pipe tube wall on which the photovoltaic cells are located to maintain the cells at a temperature low enough to enable the cells to generate electricity effectively and to maintain all of the cells along the length of the heat pipe at a substantially uniform temperature.

BRIEF DESCRIPTION OF THE DRAWINGS

FIG. 1 is a somewhat diagrammatic horizontal section through a heat pipe in accordance with the present invention.

FIG. 2 is a transverse section through the heat pipe of FIG. 1 taken on line 2—2 of that figure, and FIG. 3 is an enlarged detail plan of an end portion of such heat pipe, some parts being broken away.

FIG. 4 is a plan of several parallel heat pipes according to the present invention interconnected in a solar energy absorption array, some parts being broken away.

FIGS. 5 and 6 are somewhat diagrammatic horizontal sections through other heat pipes in accordance with the present invention.

FIG. 7 is a top perspective of a photovoltaic thermal solar energy collector in accordance with the present invention using the heat pipe of FIG. 1, some parts being broken away.

FIG. 8 is a vertical transverse section taken on line 8—8 of FIG. 7.

FIG. 9 is a plan of a photovoltaic thermal solar energy absorption array like that shown in FIG. 4 using several parallel photovoltaic thermal solar energy collectors of the type shown in FIG. 7, some parts being broken away.

FIG. 10 is a vertical section taken on line 10—10 of FIG. 9.

DETAILED DESCRIPTION

As seen in FIGS. 1, 2 and 3, the heat pipe of the present invention includes a substantially horizontal sealed cylindrical outer shell or tube 1 having a length a multiplicity of times as great as its horizontal width or diameter, enclosing a quantity of vaporizable heat transfer fluid in liquid form 2 and a vapor field 3 of volatile heat transfer fluid. The shell is disposed with its axis generally perpendicular to the rays of the sun and substantially horizontal, as shown in FIG. 1, has an exterior energy-collecting heat-conductive upper portion and is closed at both ends except for two circular apertures 4 in one end of the shell. As best seen in FIG. 3, the heat pipe also includes an internal wick 5 elongated lengthwise of the tube 1 and holding some or all of the heat transfer fluid and at least substantially covering the circumferential inner periphery of the tube 1. The wick includes a first portion in contact with vaporizable heat transfer fluid liquid and a second portion connected to the first portion and lining the major part of the energy-collecting heat-conductive portion of tube 1. Such wick can be of the type described in U.S. Pat. No. 3,779,310; for example, the wick could be fibrous material such as asbestos or it could be interconnected-pore-type foam material. Similarly, the heat transfer fluid should have the characteristics of the "free vaporizable liquid" described in that patent. In particular, the heat transfer fluid should have a high latent heat of vaporization and condensation. Water and Freon 11 are satisfactory heat transfer fluids.

According to the present invention, elongated heat transfer vapor condensing cooling means are disposed within the heat pipe tube 1 forming an elongated vapor field 3 extending throughout the energy-collecting heat conductive portion of the tube. In FIGS. 1, 2 and 3, such means are shown in the form of a coolant conduit 6 located substantially in the horizontal diametral plane of the heat pipe tube as shown in FIG. 2 and having a return bend 7. The return bend is close to the end of the heat pipe remote from the end containing the apertures 4 so that the coolant conduit extends throughout substantially the entire length of the energy-collecting heat-conductive portion of the heat pipe shell 1. The coolant conduit enters the heat pipe through one of the apertures and runs through the vapor field 3 longitudinally of the heat pipe to the return bend 7, from which it runs longitudinally back through the vapor field and through the other aperture. The apertures 4 are of a size to embrace the coolant conduit 6 snugly so that the vapor field 3 and heat transfer liquid 2 are completely sealed within the heat pipe tube 1. Like the tube, the coolant conduit is made of a heat-conductive material. The coolant can be either a gas or a liquid and can be pumped through the coolant conduit in the direction of the arrows in the left portions of FIGS. 1 and 3.

In operation, the heat pipe will be located in position for its shell or tube to absorb energy from the sun's radiation. Such energy to be absorbed is represented by the arrows in the upper portion of FIG. 1. The sun will heat the energy-collective surface portion of the heat-conductive tube or shell 1 and such heat will be conducted around and through the outer shell to warm the heat transfer liquid contained in the wick 5 lining the inner periphery of the shell. Warming of the heat transfer liquid will vaporize some of the liquid and, hence, the pressure and temperature of the vapor field 3 will be increased.

Rather than relying on cooling the exterior of one end of the heat pipe to induce condensation of the vapor in the vapor field, in accordance with prior practice such as represented by U.S. Pat. No. 3,990,914, the present invention provides condensing means within the tube 1. Coolant conduit 6 is cooled by the circulating cooling medium. Heat transfer vapor contacting the exterior of the coolant conduit will condense back into the liquid state, reducing the temperature and pressure of the vapor field. Thermal energy equal to the latent heat of condensation of the heat transfer fluid, and heat corresponding to the temperature differential between the vapor field and the coolant conduit, will thus be transferred to the coolant flowing through the coolant conduit. By continually supplying coolant at a low temperature through the coolant conduit, condensation of higher temperature heat transfer fluid vapor is promoted in that part of the vapor field through which the coolant conduit runs. If the coolant conduit extends throughout substantially the entire length of the energy-collecting heat-conductive portion of the tube 1, as shown in FIG. 1, condensation is promoted substantially equally throughout substantially the entire length of the vapor field rather than only at one end of the tube and vapor field and maintains all portions of the energy-collecting heat-conductive surface of the tube at a substantially uniform temperature.

In order to enable the upper portions of tubes 1 to absorb energy most effectively, the surface of the tube exposed to radiation should not only be of uniform temperature but the path travelled by the energy should be as short as possible. In the apparatus of the present invention, the energy collected heats the upper portion of the tube 1 as shown in FIG. 1, and the heat is utilized to vaporize liquid from the wick 5 lining the upper portion of the tube. The vapor need travel only a short distance to the cooling means in the form of conduit 6 extending through the interior of the tube in order for the cooling means to remove heat from the vapor for the purpose of again condensing liquid. Such condensed liquid drops into the body 2 of liquid in the bottom of the tube as shown in FIG. 2 from which liquid may be transferred through the wick by capillary action to the upper portion of the wick for evaporation by heat conducted inward through the upper side of the tube 1.

Important features of the invention which promote its efficiency are the short path of travel of the energy from the collecting surface formed by the upper portion 1 of the tube to the coolant fluid in the conduit 6 located generally centrally of the vapor field 3 and the uniform and minimum temperature gradient of the cooling means extending substantially throughout the length of the energy-collecting surface so that the cooling means can maintain the entire collecting surface at minimum temperature.

As shown in FIGS. 5 and 6, an alternative would be to provide a heat pipe with an aperture or apertures in each end of the shell. One or more coolant conduits 6' enter the vapor field through an aperture or apertures 4' at one end of a heat pipe tube 1' lined with wick 5' and leave the vapor field through an aperture or apertures 4'' in the other end. Coolant is passed through the coolant conduit or conduits in either direction. If all of the coolant enters one end of the heat pipe and leaves the other end, the difference in temperature between the entering and exiting coolant resulting from it being warmed in the vapor field would produce progressively less condensation of heat transfer vapor toward one end of the vapor field than at the other end. Consequently, in the heat pipe shown in FIG. 5, the heat pipe shell 1' is progressively hotter toward one end and the hotter end is not able to absorb as much energy as the cooler end. It is therefore preferable to provide an even number of coolant conduits extending through the heat pipe vapor field and to pass coolant through the two conduits of each pair in opposite directions to balance the temperature gradients along the coolant conduits. Thus, in the heat pipe shown in FIG. 6, as in the heat pipe shown in FIG. 1, condensation occurs approximately uniformly throughout the length of the vapor field 3'. The single, return bent coolant conduit is preferred, however, since it provides a simpler and less expensive way to balance the temperature difference between entering and exiting coolant.

Comparative tests were run to determine the effect of different lengths of coolant conduit on the heat gradient in the shell 1. A sixty inch (1.52 m) heat pipe three inches (7.62 cm) in diameter was used and the upper side of the heat pipe outer shell was exposed to the same amount of heat in each test. In each test the heat pipe was positioned so that there would be uniform exposure to the sun's rays along the entire length of the tube. Water circulating at a constant rate was used as the coolant.

In a first installation the coolant conduit 6 was positioned with its return bend 7 located about nine inches (22.86 cm) from the two apertures 4 so that about 85% of the length of the vapor field contained no condensing means. The end of the shell remote from the apertures 4 was found to be substantially hotter than the end containing the apertures. The temperature was 75° F. (24° C.) at the apertured end and 175° F. (80° C.) at the opposite end. In a second test installation the coolant conduit was positioned with the return bend 7 located forty inches (1.02 m) from the apertures, that is, one-third of the length of the vapor field did not have condensing means. The temperature at the apertured end of the heat pipe was 75° F. (24° C.) but at the remote end the temperature was 90° F. (32° C.). In a third test installation the condensing pipe was positioned such that it ran substantially the entire length of the shell 1—the return bend 7 was approximately 59 inches (1.50 m) from the apertures—and there was no appreciable difference in the surface temperatures of the opposite ends of the shell.

The capacity of a body to absorb energy, especially radiant energy, decreases as the temperature of the body increases. Since the present invention provides a heat pipe which will maintain a uniformly low surface temperature throughout its length while absorbing energy and transferring the absorbed energy to an internally circulating coolant, it can be used as a highly efficient blackbody for absorbing radiant energy. One such use is as a solar energy collector. It follows that the circulating coolant could then be used as the heat-extracting medium of a solar energy collecting device.

The array of parallel heat pipes shown in FIG. 4 is particularly useful as a solar energy collector. Such array includes a plurality of separate elongated substantially straight cylindrical tubes arranged in side-by-side relationship with their axes horizontal, as shown in FIG. 1, and substantially coplanar with the plane of the axes of the tubes disposed generally perpendicular to the rays of the sun. One supply conduit 8 supplies coolant to several coolant conduits in the vapor fields of several heat pipes which are connected in parallel to such supply conduit. The coolant is returned from the same end of the heat pipes to one discharge conduit 9 to which the coolant conduits are connected in parallel. The coolant conduit 6 within each heat pipe tube 1 is of return bent shape with one end of each conduit connected to supply conduit 8 and the other end connected to discharge conduit 9. The heat pipes are attached to a mounting plate 10 and are in side-by-side closely spaced parallel relationship, that is, adjacent cylindrical heat pipe tubes are spaced apart less than the length of a radius of such a tube, as shown in FIG. 4. The heat pipe tubes are thus sufficiently closely spaced so that isolation rays that are not fully absorbed by the energy-collecting heat-conductive upper portions of the tubes are reflected from the side of one heat pipe will contact and be absorbed by an adjacent heat pipe. For the most efficient use of the array, the axes of the heat pipes must be horizontal to maintain a uniform depth in the body of liquid 2 throughout the length of the tube and the plane of the axes of the heat pipes should be maintained perpendicular to the rays of the sun. In a representative installation, the heat pipes can be sixty inches (1.52 m) long and three inches (7.62 cm) in diameter.

The efficiency of heat pipes in accordance with the present invention as solar energy collectors was tested in an experiment at Tacoma, Washington. Sixty inch (1.52 m) heat pipes three inches (7.62 cm) in diameter, having wicks and internal coolant conduits, were exposed to the sun over a period of several months. For comparison, conventional black plate water panels like those currently used in solar energy devices were exposed during the same period. Separate streams of water were run through the condensing pipes and under the flat black panels at a rate of 1 pound per minute to act as a coolant and heat extracting medium. Identical calorimeter testing methods were used to determine how much energy had been collected and transferred to the circulating water for each set of devices. Both the panels and the pipes were mounted on apparatus which constantly maintained the exposure surfaces perpendicular to the sun's rays during the daylight hours. In addition, the heat pipes were covered with a plastic material so that infrared light waves reflected by the heat pipe outer shells would be re-reflected back toward the heat pipes. The results are contained in the table which follows:

| Weather | Energy Collected & Transferred to Coolant (British Thermal Units per hour per square foot of exposure area) | |
|---|---|---|
| | Black Water Panels | Black Heat Pipes |
| Medium Clouds | 136 | 200 |
| Light Clouds | 153 | 230 |
| No Clouds | 200 | 260 |

A major problem with solar energy devices in general is that a very large exposure area is required to collect and transfer a usable amount of energy. As shown in the table, if heat pipes according to the present invention are substituted for conventional flat black panels now commonly used, the exposure area required to collect and transfer a given amount of energy is drastically reduced.

The choice of coolant will depend upon how the coolant is to be utilized. In some applications it will be desirable that the exiting coolant be in liquid form with a high boiling point so that stream or vapor is not formed in the coolant conduit. Pressurizing the coolant would result in raising the boiling point. In other applications it will be desirable that coolant be in the form of gas in which case a coolant with a relatively low boiling point can be chosen. A gaseous coolant can also be pressurized to raise its boiling point or it can be maintained at a value below atmospheric pressure to lower its boiling point. In all applications, it is desirable that the temperature of the entering coolant be as low as possible so that the heat pipe shell can operate at a low temperature to increase the energy-collecting effectiveness of the shell.

In the embodiment of the present invention shown in FIGS. 7 and 8, elongated photovoltaic cell means including a row of photovoltaic cells 11, each cell having a target area 12, is mounted on the wall of an elongated heat pipe 13 in heat transfer relationship to such wall. For example, the cells may be secured to a strip 14 of beryllium, aluminum or other highly heat-conductive material and such strip may be secured to the outer surface of the heat pipe. To concentrate solar rays for impinging high intensity or concentrated solar energy onto the target areas of the cells, an elongated lens, such as the plano-convex Fresnel lens 15 shown in the drawings, is positioned with its focus near the cell target areas. The heat pipe, cells and lens may be carried by a suitable tracking device for maintaining the cell target areas and the lens substantially perpendicular to rays from the sun. The cells in the row may be electrically connected in series or in parallel to obtain a desired electrical output.

Impinging solar rays onto the target of a photovoltaic cell not only converts some of the radiant energy of the rays into electrical energy but also warms the cell. If the impinging rays are highly concentrated, that is, if high luminous flux density solar energy is impinged onto the cell target, the cell may be warmed above about 60° C., whereupon the electrical output of the cell decreases. 50° C. to 60° C. may be referred to as the "threshold temperature range" of photovoltaic cells since in a conventional cell the electrical output decreases dramatically, substantially linearly with temperature increase, if the cell is warmed above such temperature range. By mounting a row of photovoltaic cells along the length of a heat pipe, and by providing means for removing thermal energy uniformly along the length of the heat pipe, the temperature of all the cells on the heat pipe can be maintained below their threshold temperature and near their optimum electrical energy producing temperature.

In the embodiment of the invention shown in FIGS. 7 and 8, the heat pipe is of the type shown in FIGS. 1, 2 and 3, such heat pipe being provided with an internal condenser for circulating a fluid coolant through the heat pipe vapor field. Heat from the cells is conducted through cell-mounting strip 14 to the surface of the elongated heat pipe 13. Such heat is quickly transferred through the heat pipe shell and circumferentially of it for warming heat transfer vapor and for vaporizing liquid within the wick 13' of the heat pipe into the vapor field as explained in connection with FIGS. 1 to 6. A heat-conductive conduit 16 circulates a fluid coolant through the heat pipe vapor field to remove thermal energy from vapor of the vapor field and condense such vapor. By this operation excess thermal energy is removed from the photovoltaic cells to keep each of them substantially at a desired temperature. Such thermal energy is not wasted but is transferred to the circulating coolant for beneficial use.

It is important that heat from the photovoltaic cell means 11 is removed by evaporation of heat transfer fluid from the wick 13' and the heat transfer fluid vapor passes into the vapor field in the central portion of the heat pipe. Since such vapor field is cooled by the coolant circulated lengthwise of the vapor field through conduit 16 which acts to condense heat transfer fluid vapor, the surface of the heat pipe 13 is cooled effectively, quickly and substantially uniformly throughout the length of the vapor field. The condensate can be absorbed by the wick means and migrate transversely of the length of the heat pipe to the region of the photovoltaic means where it is heated to be vaporized again.

The solar energy collector array shown in FIG. 9 is similar to the solar absorption collector array shown in FIG. 4 except that the array of FIG. 9 uses photovoltaic thermal collectors of the type shown in FIGS. 7 and 8. As in the embodiment of the invention shown in FIG. 4, the heat pipes 13 of the array of FIG. 9 have internal return bent condensing conduits 16 extending throughout substantially the entire length of the vapor field of such heat pipe for circulating a coolant lengthwise of the vapor field in both directions. Mounted over each pipe is an elongated lens 15 for focusing solar rays onto the targets 12 of a linear row of photovoltaic cells 11 mounted on such heat pipe. If, as in the form of apparatus shown in FIG. 4, photovoltaic cells are not carried by the heat pipes, the Fresnel lenses can be located closer to the heat pipes so that a wider band of the heat pipe tube upper surface will be heated, such as over an arc of 20° or 30°. Such concentration of insolation will provide a greater heating effect of facilitate evaporation of heat transfer fluid from the wick 13'.

The several pipes are arranged in side-by-side closely spaced parallel relationship with adjacent cylindrical tubes spaced apart less than the length of a radius of a tube so that any energy rays reflected from the cells or the side of one heat pipe will contact and be absorbed by an adjacent heat pipe.

The internal condensing conduits 16 maintain the surface temperature of their respective heat pipes, and, consequently, maintain the temperature of each of the photovoltaic cells mounted on such a heat pipe, at substantially a uniform temperature. Preferably, the condensing conduits 16 of the various pipes are connected in parallel, that is, coolant is fed to one leg of each return bent conduit 16 by a single supply pipe 17 and discharged from the other leg of such conduit into a single discharge pipe 18 so that all of the heat pipes are maintained at the same temperature.

In the embodiments of FIGS. 7 and 8 and FIG. 9 the row or rows of photovoltaic cells can be maintained at a desired temperature by controlling the flow rate of fluid coolant such as by thermostatic valves responsive to the temperature of the cells. Additionally or alternatively the temperature of the cells can be controlled by controlling the temperature of the coolant. In either case, the flow rate or temperature of the coolant can be selected so as to maintain each of the cells at its optimum temperature for converting solar insolation received on the cell target area into a maximum amount of electricity. Further, heat removed from the cells is transferred to the circulating coolant and utilized beneficially rather than being wasted.

The warmed coolant discharged from the heat pipe can be used as the operating fluid of conventional radiator type heaters. Alternatively, the internal condensing mechanism can be used to heat operating fluid for such devices as steam generators. If it had a sufficiently low vaporization temperature, the coolant could be pressurized to prevent it from boiling while being circulated through the heat pipe vapor field and then, after leaving the field, the pressure could be reduced so that the coolant is converted to vapor to drive the generator turbine. In this type of application it would be preferable to pressurize the coolant to a pressure of at least 2 or 3 atmospheres. Another alternative is to use the condensing mechanism to preheat the generator operating fluid for reducing the energy required to convert liquid to gas.

I claim:

1. Apparatus for collecting and converting solar energy comprising a plurality of separate elongated substantially straight cylindrical tubes arranged in side-by-side relationship with their axes substantially coplanar, spaced apart transversely of their lengths a distance less than the radius of one of said tubes, with the plane of the axes of said tubes disposed generally perpendicular to the rays of the sun and with the axis of each tube horizontal, the length of each tube being a multiplicity of times as great as its diameter, each tube being sealed and having a heat-conductive portion forming an exterior energy-collecting surface for receiving insolation and located sufficiently close to the exterior energy-collecting surface of an adjacent tube that at least a substantial portion of the energy not absorbed by said heat-conductive portion and reflected from each tube impinges on and is absorbed by the heat-conductive portion of an adjacent tube, a body of vaporizable heat transfer fluid liquid within the bottom portion of each tube, a wick within each tube including a first portion in contact with said vaporizable liquid and a second portion connected to said first portion and lining the major part of said energy-collecting heat conductive tube portion in intimate heat-conducting contact therewith, cooling conduit means for each tube extending from outside of such tube into such tube above said liquid body in the bottom of such tube and axially substantially throughout the length of such tube substantially in its horizontal diametral plane for utilizing energy collected by said energy-collecting surface to vaporize liquid from said second portion of said wick to be condensed subsequently by transfer of heat to fluid in said cooling conduit means for return to said liquid body in the bottom of such tube and thereby heat said cooling means fluid, each of said cooling conduit means including a first conduit portion for conveying fluid coolant lengthwise of its tube in one direction through substantially the entire length of the energy-collecting heat-conductive portion of such tube and a second conduit portion for conveying fluid coolant lengthwise of such tube in the opposite direction through substantially the entire length of the energy-collecting heat-conductive portion of such tube for maintaining substantially all portions of the energy-collecting surface of such tube at a substantially uniform temperature, fluid supply means connecting said first conduit portions of said cooling conduit means for said plurality of tubes in parallel for inflow of cooling fluid at substantially the same temperature to all of said first conduit portions, and fluid discharge means connecting said second conduit portions of said cooling conduit means for said plurality of tubes in parallel for receiving heated fluid from all of said second conduit portions to circulate cooling fluid through said cooling conduit means.

2. The apparatus defined in claim 1, and a row of photovoltaic cells mounted on and extending throughout substantially the entire length of the energy-collecting heat-conductive portion of each tube and being in heat-conducting relation thereto.

3. Apparatus for collecting and converting solar energy comprising an elongated substantially straight sealed cylindrical tube disposed with its axis substantially horizontal and having a heat-conductive portion forming an exterior energy-collecting surface for receiving insolation, the length of said tube being a multiplicity of times as great as its diameter, a body of vaporizable liquid within the bottom portion of said tube, a wick within said tube including a first portion in contact with said vaporizable liquid and a second portion connected to said first portion and lining the major portion of said energy-collecting heat-conductive tube portion in intimate heat-conducting contact therewith, cooling conduit means extending from outside of said tube into said tube above said liquid body in the bottom of said tube and axially substantially throughout the length of said tube substantially in its horizontal diametral plane for utilizing energy collected by said energy-collecting surface to vaporize liquid from said second portion of said wick to be condensed subsequently by transfer of heat to fluid in said cooling conduit means for return to said liquid body in the bottom of said tube and thereby heat said cooling means fluid, said cooling conduit means including a first conduit portion for conveying fluid coolant lengthwise of said tube in one direction through substantially the entire length of the energy-collecting heat-conductive portion of said tube and a second conduit portion for conveying fluid coolant lengthwise of said tube in the opposite direction through substantially the entire length of the energy-collecting heat-conductive portion of said tube for maintaining substantially all portions of said energy-collecting surface of said tube at a substantially uniform temperature, and means for circulating coolant fluid through said cooling conduit means.

4. The apparatus defined in claim 3, in which the elongated heat-conductive portion of the sealed tube has photovoltaic cell means extending throughout substantially the entire length of said heat-conductive portion for receiving insolation.

5. Mechanism for utilizing solar energy comprising an elongated substantially horizontal heat pipe having a length a multiplicity of times as great as its horizontal width and containing volatile heat transfer fluid for forming a vapor field within said heat pipe, elongated photovoltaic cell means extending lengthwise of and mounted on a wall of said heat pipe in heat transfer relationship thereto, elongated wick means lining in heat-conducting relationship the inner side of said heat pipe wall on which said photovoltaic cell means are mounted for emitting vapor of said heat transfer fluid volatilized by heat received from said elongated photovoltaic cell means, and elongated cooling fluid conduit means within said heat pipe and extending lengthwise through the vapor field for removing heat from heat transfer fluid vapor in the vapor field and thereby condensing heat transfer fluid to be absorbed by said wick means for migration therethrough transversely of the length of said heat pipe to a location of the heat pipe wall on which said elongated photovoltaic cell means are mounted for maintaining substantially all portions of said elongated photovoltaic cell means at a substantially constant uniform temperature.

6. The method of collecting and converting energy which comprises supporting substantially horizontally an elongated substantially straight sealed cylindrical tube having a length a multiplicity of times as great as its diameter and having a body of vaporizable liquid in the bottom portion thereof and a heat-conductive portion forming an exterior energy-collecting surface for receiving insolation and having a wick within the tube including a first portion in contact with the vaporizable liquid and a second portion connected to the first portion and lining the major part of the heat-conductive tube portion, exposing the energy-collecting surface portion of the tube to insolation for heating the energy-collecting heat-conductive portion of the tube and thereby evaporating from the second portion of the wick lining liquid transferred through the wick from the liquid in the bottom of the tube, and maintaining substantially all portions of the energy-collecting surface of the tube at a substantially uniform temperature by flowing coolant fluid substantially constantly through conduit means extending from outside of the tube throughout substantially the entire length of the heat-conductive portion of the tube substantially in its horizontal diametral plane lengthwise of such heat-conductive portion in both directions and thereby withdrawing heat from the vapor in the tube for condensing such vapor for return to the liquid body and correspondingly heating simultaneously the coolant fluid flowing through the conduit means.

7. The method of utilizing solar energy which comprises locating elongated photovoltaic cell means for reception of insolation to generate electric energy, removing heat from the photovoltaic cell means substantially uniformly along its length by evaporating volatile heat transfer fluid from wick means within a substantially horizontal elongated heat pipe having a length a multiplicity of times as great as its horizontal width and lining in heat-conducting relationship the side thereof on the exterior of which heat pipe side the elongated photovoltaic cell means are mounted for emergence of voltaile heat transfer fluid vapor from the wick means into an elongated vapor field extending lengthwise within the heat pipe, and circulating coolant fluid separate from the volatile heat transfer fluid lengthwise through the elongated heat transfer fluid vapor field within the heat pipe for removing heat energy from such vapor field substantially uniformly throughout the length of such vapor field and thereby condensing volatile heat transfer fluid for absorption by the wick means and migration therethrough transversely of the length of the heat pipe to the region of the elongated photovoltaic cell means to be again vaporized by heat received from such photovoltaic cell means.

* * * * *

UNITED STATES PATENT AND TRADEMARK OFFICE
CERTIFICATE OF CORRECTION

PATENT NO. : 4,320,246
DATED : March 16, 1982
INVENTOR(S) : George F. Russell

It is certified that error appears in the above-identified patent and that said Letters Patent are hereby corrected as shown below:

Column 12, line 35, cancel "voltaile" and insert ---volatile---.

Signed and Sealed this

Twenty-fifth Day of May 1982

[SEAL]

Attest:

GERALD J. MOSSINGHOFF

Attesting Officer     Commissioner of Patents and Trademarks